United States Patent
Givens et al.

(10) Patent No.: US 6,450,837 B1
(45) Date of Patent: Sep. 17, 2002

(54) ELECTRICAL CONNECTOR HAVING SURGE SUPPRESSING DEVICE

(75) Inventors: David F. Givens; Leonard K. Espenshade, both of Harrisburg, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/046,495

(22) Filed: Oct. 29, 2001

(51) Int. Cl.[7] .............................................. H01R 13/66
(52) U.S. Cl. ..................... 439/620; 439/676; 439/76.1; 439/607
(58) Field of Search ................................ 439/620, 607, 439/676, 941, 76.1, 108, 79, 548, 557

(56) References Cited

U.S. PATENT DOCUMENTS

| | | | |
|---|---|---|---|
| 4,799,901 A | * 1/1989 | Pirc | 439/620 |
| 6,179,668 B1 | * 1/2001 | Kan | 439/620 |
| 6,328,603 B1 | * 12/2001 | Chang | 439/620 |
| 6,334,787 B1 | * 1/2002 | Chang | 439/620 |
| 6,344,969 B1 | * 2/2002 | Lord et al. | 439/620 |

* cited by examiner

Primary Examiner—Tho D. Ta
(74) Attorney, Agent, or Firm—Wei Te Chung

(57) ABSTRACT

An electrical connector includes an insulative housing (1) receiving a plurality of terminals (24, 25) therein, a shield (3) enclosing the insulative housing for engaging with a grounded chassis (5), and a surge suppressing device (28) received in the insulative housing. The surge suppressing device includes a dielectric substrate (21) with interconnected surge suppressing circuitry and conductive signal traces (215) provided on respective opposite major sides thereof, and a grounding clip (23) mounted on the dielectric substrate and contacting with an inner surface of the shield. The terminals are electrically connected with the conductive signal traces.

8 Claims, 7 Drawing Sheets

ELECTRICAL CONNECTOR HAVING SURGE SUPPRESSING DEVICE

CROSS REFERENCE TO RELATED APPLICATIONS

This application relates to co-pending U.S. patent application Ser. No. 09/844,556, filed Apr. 27, 2001.

BACKGROUND OF THE INVENTION

1. Field of the Invention

The present invention relates to an electrical connector, and particularly to a modular jack having a built-in device providing surge suppressing protection for conductive circuits to which the connector contacts are electrically connected.

2. Description of Related Art

Modern electrical equipment typically contains complex electrical circuitry which is susceptible to damage from electrical surges. Such damage ranges from a momentary interruption of operation to total overload and burn-up of electrical circuits. In order to protect electrical equipment from damage due to overvoltage and/or overcurrent resulted from electrical surges, devices such as surge suppressors or surge protectors have been introduced. Such a surge suppressor normally contains circuitry that responds to a rate of change of a current or voltage to prevent a rise above a predetermined value of the current or voltage and typically includes resistors, capacitors, coils, tubes and semiconductor devices.

Generally, a modular jack employed in an electronic appliance, such as a telephone, cooperates with a surge suppressor to protect the electronic appliance from electrical surge. However, conventionally, the modular jack and the surge suppressor are configured as separate parts and are individually mounted on a printed circuit board, which consumes significant space on the printed circuit board. In this case, conductive circuits are further required to connect the parts with each other, which also consumes space on the printed circuit board. Thus, a modular jack with a built-in surge suppressor is desired.

Modular jacks with built-in surge suppressing device are disclosed in U.S. Pat. Nos. 4,726,638 and 5,139,442. U.S. Pat. No. 4,726,638 discloses a surge suppressing device consisting of a dielectric substrate with a ground surface area on a lower surface thereof, a plurality of surge protectors mounted on an upper surface of the substrate and connected to the ground surface area through apertures in the substrate, and a ground plate attached to the bottom of the jack housing and contacting the ground surface area. The surge suppressors are in the form of diodes and are connected to respective jack contacts via conductive paths on the substrate. The substrate is partially received in the housing and extends beyond the rear major side of the housing to engage with the ground plate, which occupies significant space. Alternatively, the substrate is attached to the bottom of the housing, whereby the height of the modular jack is increased. Furthermore, the ground plate is individually attached to a bottom surface of the housing, which requires modification to the housing according to the specific configuration of the ground plate, thereby complicating manufacture and increasing production cost.

U.S. Pat. No. 5,139,442 discloses, in FIGS. 7–11, a modular jack having a built-in surge suppressing device consisting of a grounding terminal 53 insert molded in the jack housing 10 and a varistor 51 functioning as a surge suppressor. The varistor has electrodes 52a, 52b and 52c printed on upper and lower sides thereof for respectively soldering to the jack contacts 5 and the grounding terminal 53. Accordingly, both manufacture and assembly of the modular jack are complicated since insert-molding process and tedious soldering process are employed. Furthermore, the grounding terminal has a pair of legs 55 extending along opposite outer sides of the housing for connecting with a printed circuit board 9 on which the modular jack is mounted. Thus, electrical surge received by the contacts is suppressed to ground via the varistor, the grounding terminal, the printed circuit board, and a conductive chassis within which the printed circuit board is mounted. This requires a long, high-resistance path to ground, and thus surge suppressing efficiency is adversely affected.

Hence, a modular jack having an improved built-in surge suppressing device is required to overcome the disadvantages of the prior art.

SUMMARY OF THE INVENTION

Accordingly, one object of the present invention is to provide a modular jack having a surge suppressing device including a dielectric substrate, a plurality of surge protectors and a grounding clip, all of which are completely received in an insulative housing of the modular jack.

Another object of the present invention is to provide a modular jack having an easily assembled built-in surge suppressing device.

further object of the present invention is to provide a modular jack having a built-in surge suppressing device which establishes a short, low-resistance ground path for maximum efficiency.

Yet another object of the present invention is to provide a modular jack with little modification to the existing housing configuration to accommodate a surge suppressing device.

In order to achieve the objects set forth, a modular jack in accordance with the present invention comprises an insulative housing receiving a plurality of terminals therein, a shield enclosing the insulative housing for engaging with a grounded chassis, and a surge suppressing device completely received in the insulative housing. The surge suppressing device includes a dielectric substrate with surge suppressing circuitry and conductive signal traces provided on respective opposite major sides thereof, and a grounding clip mounted on the dielectric substrate and contacting with an inner surface of the shield. The terminals are electrically connected with the conductive signal traces, and the conductive signal traces are electrically interconnected with the surge suppressing circuitry via plated tunnels defined through the dielectric substrate.

Other objects, advantages and novel features of the invention will become more apparent from the following detailed description when taken in conjunction with the accompanying drawings.

DETAILED DESCRIPTION OF THE INVENTION

Figure 1:
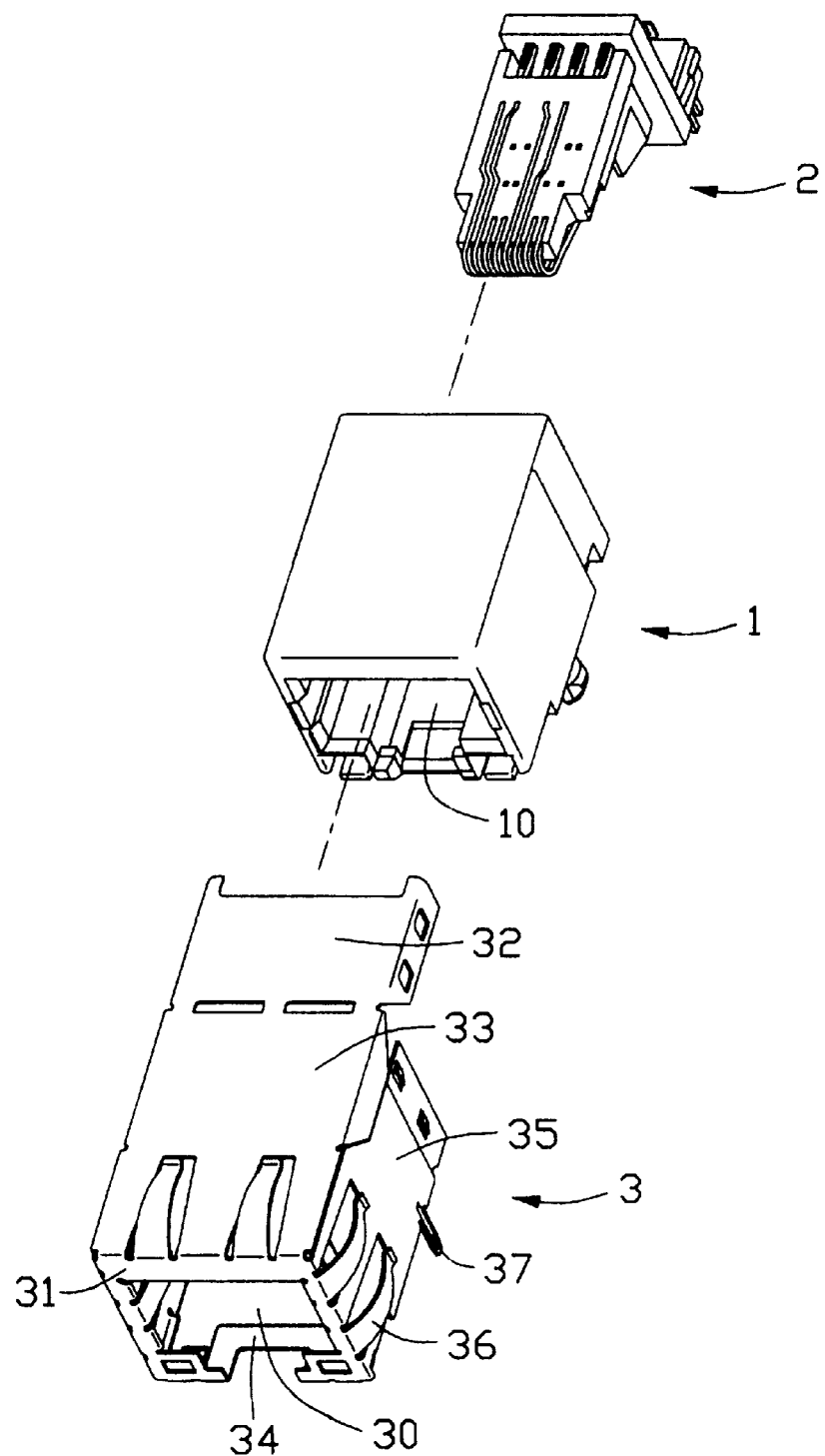
FIG. 1 is an exploded, perspective view of a modular jack which incorporates a surge suppressing device in accordance with the present invention.

Reference will now be made to the drawing figures to describe the present invention in detail.

FIG. 1 shows an exploded, perspective view of a modular jack which incorporates a surge suppressing device in accordance with the concept of the present invention. The modular jack comprises a rectangular insulative housing 1 defining a front plug-receiving cavity 10 and a rear open-ended cavity 11 (FIG. 7), an insert module 2 for inserting into the rear cavity 11 of the insulative housing 1, and a shield 3 for enclosing the insulative housing 1.

The shield 3 includes opposite front and rear plates 31 and 32, opposite upper and lower plates 33 and 34, and opposite side plates 35 for cooperatively enclosing the insulative housing 1. In FIG. 1, the rear plate 32 is shown in a horizontal orientation before downward bending. An opening 30 is defined in the front plate 31 corresponding to the front cavity 10 of the insulative housing 1 for access of a complementary modular plug (not shown). A plurality of spring tangs 36 extend rearward from peripheral edges of the front plate 31, the function of which will be given hereinafter. Each side plate 35 has a grounding pin 37 downwardly extending from a lower edge thereof for connecting with a printed circuit board 4 (FIG. 7) on which the modular jack is mounted.

Figure 2:
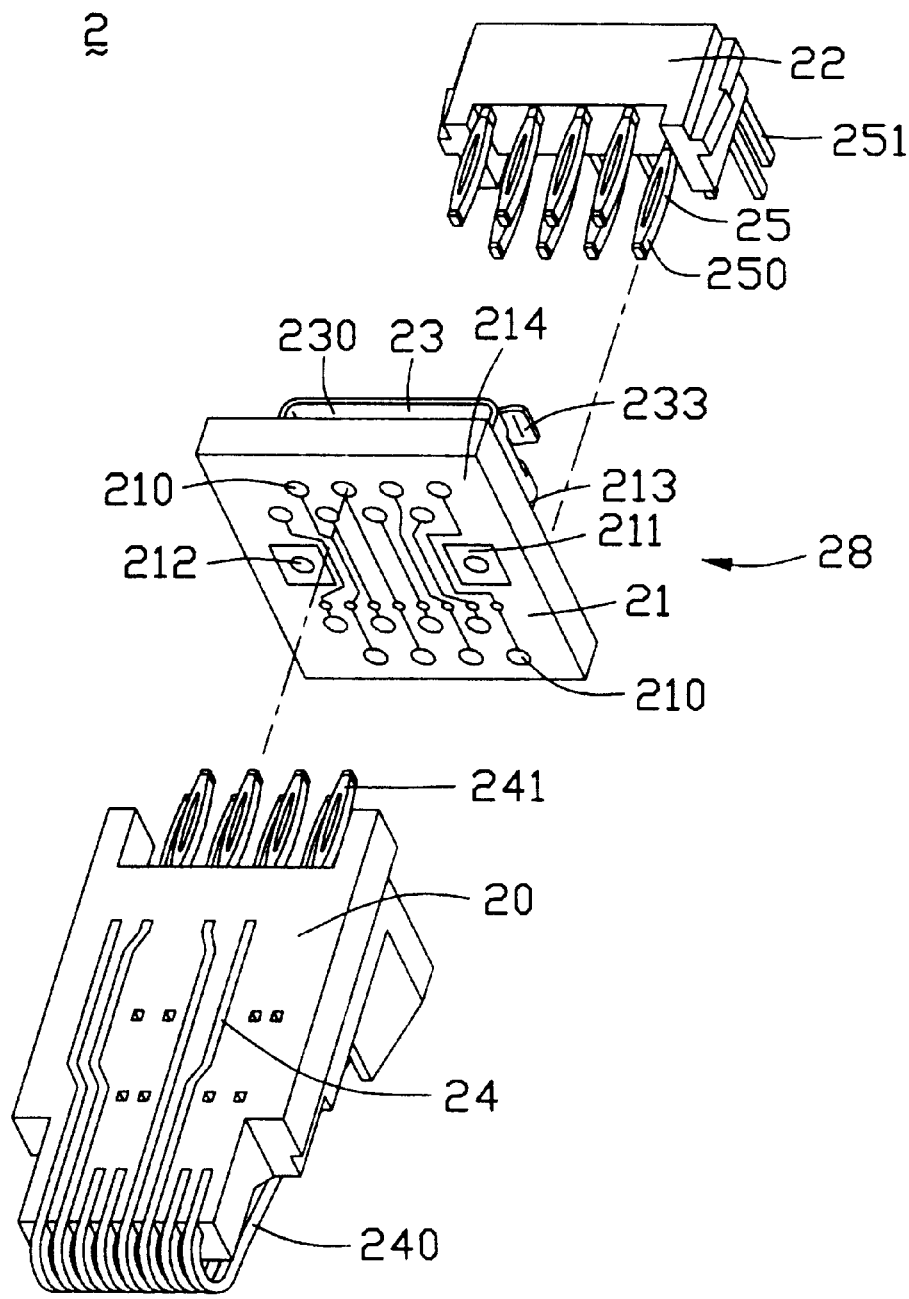
FIG. 2 is an exploded, perspective view of an insert module shown in FIG. 1.

As is shown in FIG. 2, the insert module 2 includes an insert 20 having a plurality of insert molded terminals 24, a surge suppressing device 28 for being vertically assembled to the rear of the insert 20, and a footer 22 having a plurality of insert molded terminals 25 for being assembled to the surge suppressing device 28 from the rear.

The terminals 24 of the insert 20 include downwardly and rearwardly extending front mating portions 240 for engaging with corresponding contacts of the complementary modular plug (not shown), and rear press-fit eyelet portions 241. Similarly, the terminals 25 of the footer 22 include front press-fit eyelet portions 250, and downwardly extending rear pin portions 251 for connecting with the printed circuit board 4.

Figure 3:
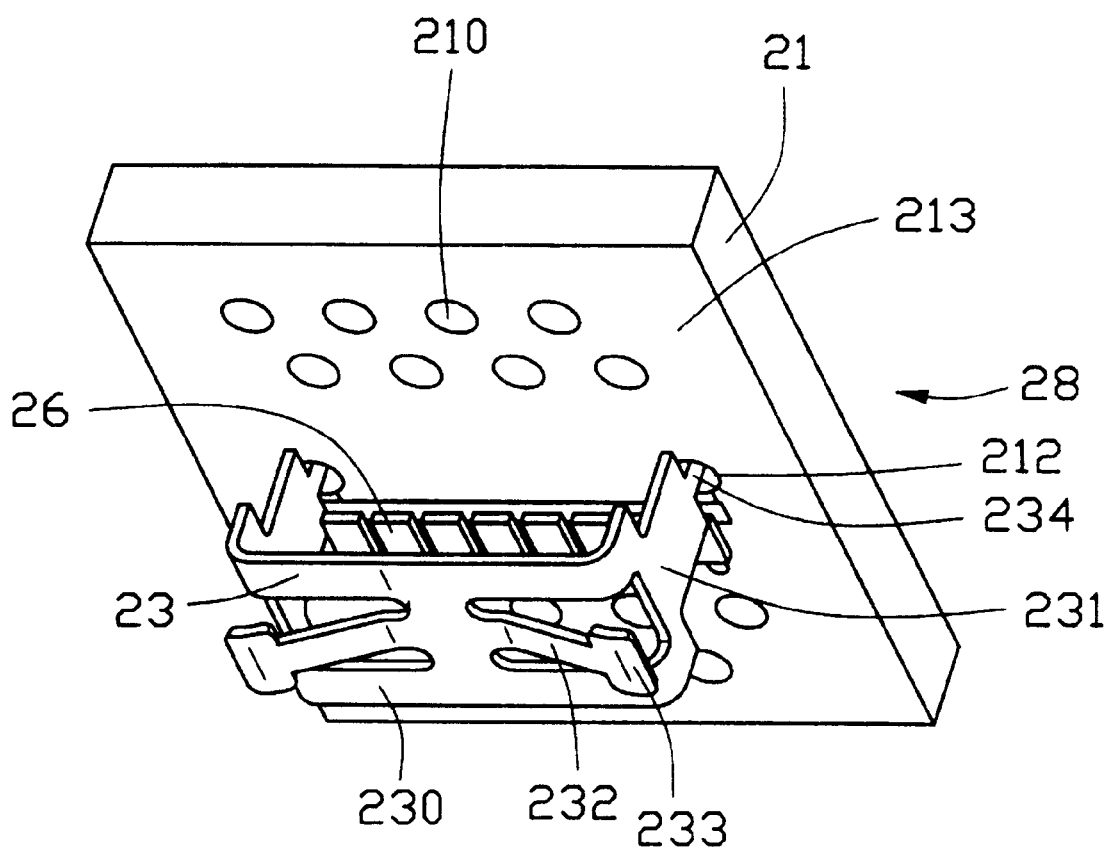
FIG. 3 is a rear, perspective view of a surge suppressing device shown in FIG. 2.

The configuration of the surge suppressing device 28 is explicitly shown in FIGS. 2 and 3. The surge suppressing device 28 includes a dielectric substrate 21 and a grounding clip 23 mounted on a rear major side 213 of the substrate 21. The dielectric substrate 21 includes upper and lower arrays of staggered through holes 210 for respectively receiving the press-fit eyelet portions 241 and 250 of the terminals 24 and 25, and two conductive solder pads 211 on a front major side 214 thereof between the upper and lower arrays of staggered through holes 210 and proximate to opposite lateral edges thereof. Two plated apertures 212 are defined through the substrate 21 and the respective solder pads 211 for engaging with the grounding clip 23. The grounding clip 23 is substantially U-shaped and includes a base portion 230 and a pair of side portions 231 extending from opposite ends of the base portion 230. The base portion 230 includes a pair of outwardly stamped spring fingers 232 each having a large-dimensioned engaging tab 233 at a free end thereof. Each side portion 231 has a small-dimensioned pin 234 at a free end thereof for inserting into and soldering to a corresponding plated aperture 212 of the substrate 21.

Figure 4:
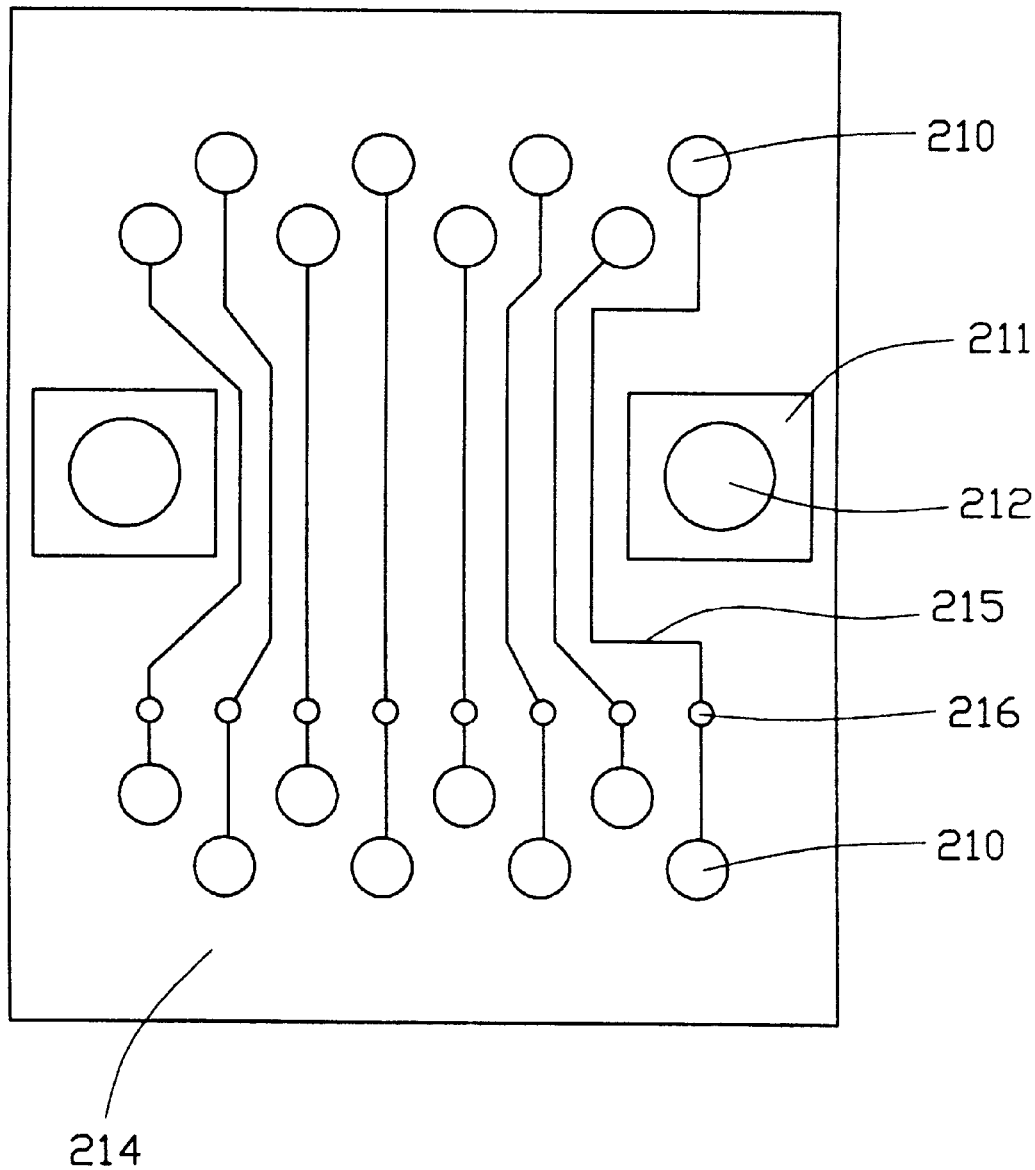
FIG. 4 is a front view of a dielectric substrate of the surge suppressing device.
Figure 5:
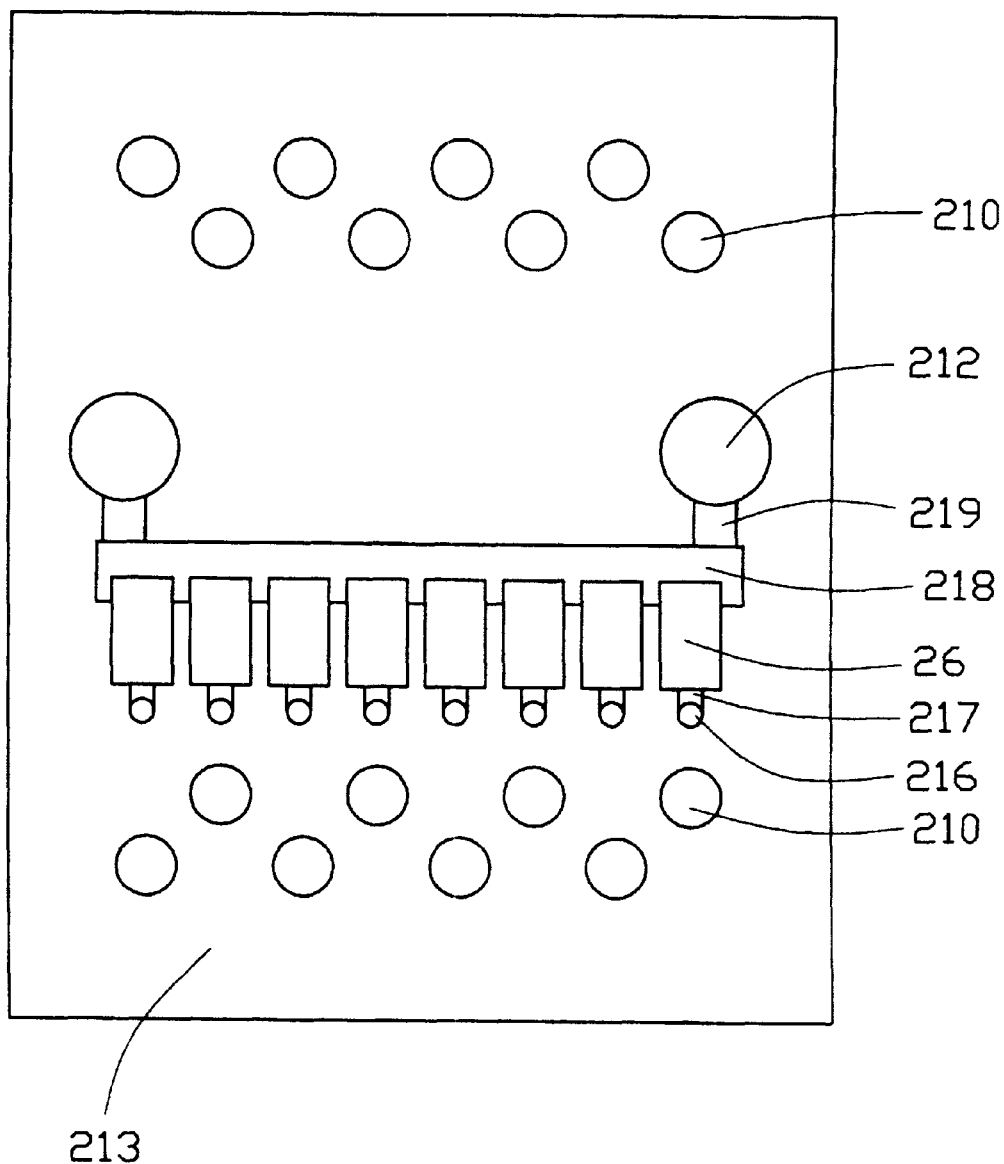
FIG. 5 is a rear view of the dielectric substrate with surge protectors mounted thereon.

As is clearly shown in FIGS. 4 and 5, a plurality of conductive signal traces 215 is provided on the front major side 214 of the substrate 21 each interconnecting a corresponding pair of aligned upper and lower through holes 210. The rear major side 213 of the substrate 21 provides a surge suppressing circuitry which includes a plurality of first traces 217, a plurality of surge protectors 26, an elongate grounding strip 218, and a pair of second traces 219 each interconnecting the grounding strip 218 with a corresponding plated aperture 212. Each surge protector 26, in the form of a capacitor in this preferred embodiment, is connected with a corresponding first trace 217 and the grounding strip 218 by soldering. The first traces 217 are connected with corresponding signal traces 215 on the front major side 214 via a plurality of plated tunnels 216.

Figure 6:
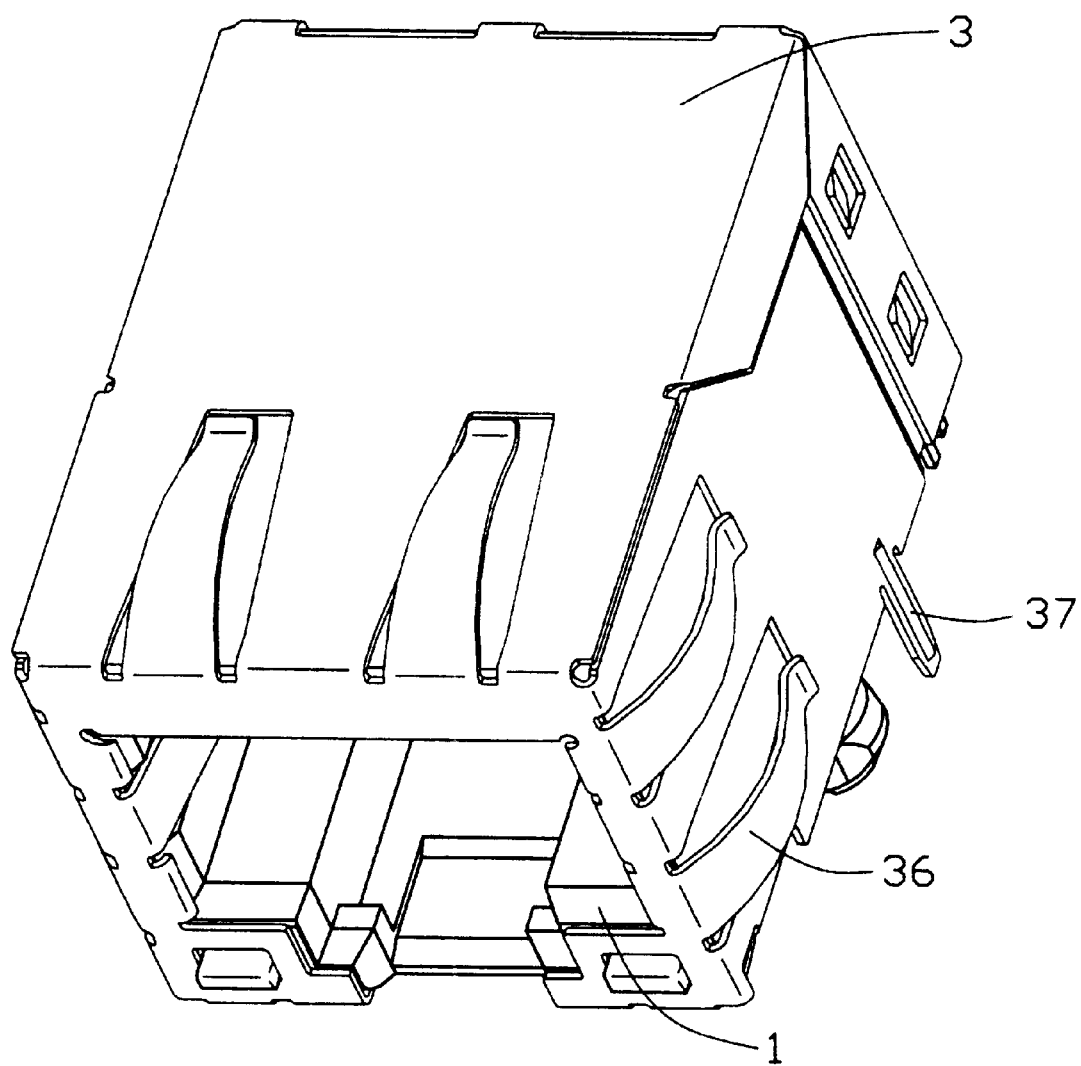
FIG. 6 is an assembled view of FIG. 1.
Figure 7:
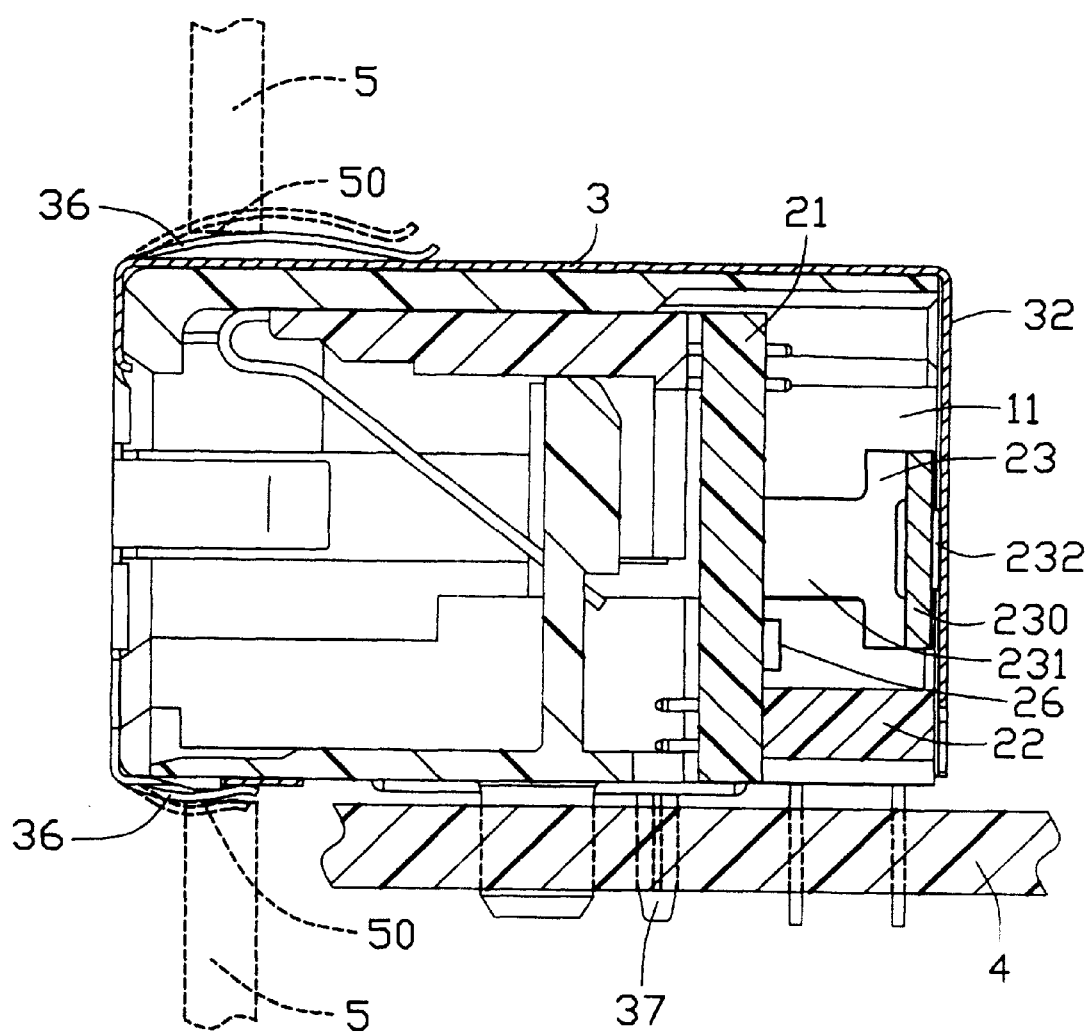
FIG. 7 is a cross-sectional view illustrating establishment of a ground path between an electronic device chassis and the dielectric substrate of the modular jack by way of the grounding clip.

As is illustrated in FIGS. 6 and 7, when the insert module 2 is assembled into the interior of the insulative housing 1 from the rear, both the surge suppressing device 28 and the footer 22 are received within the rear cavity 11 of the insulative housing 1. The rearwardly extending spring fingers 232 of the grounding clip 23 resiliently engage with an inner surface of the rear plate 32 of the shield 3. The large-dimensioned engaging tabs 233 of the spring fingers 232 ensure a reliable contact with the rear plate 32 of the shield 3. When the assembled modular jack as shown in FIG. 6, together with the printed circuit board 4, is assembled to an electronic device (not shown), a front portion of the modular jack extends through an opening in a grounded conductive chassis 5 of the electronic device, whereby the spring tangs 36 of the shield 3 are compressed against peripheral edges 50 of the chassis 5 configuring the opening. Thus, a ground path is established between the electronic device chassis 5 and the substrate 21 through the grounding clip 23 and the shield 3.

The surge suppressing device 28 of the present invention normally provides a signal path between the terminals 24 and 25 via the signal traces 215 on the front major side 214 of the substrate 21 until a voltage or current surge (e.g. lightning) occurs. When the surge occurs, the voltage or current exceeding a specified level will be shorted from the terminals 24 to the chassis 5 via a ground path through the plated tunnels 216, the surge suppressing circuitry, the apertures 212, the grounding clip 23 and the shield 3. Thus, the surge is effectively shunted to ground and the printed circuit board 4 is protected from damage. By the provision of the surge suppressing device 28, a short, well balanced and low-resistance ground path for maximum efficiency is established compared with the conventional design. Further, in case the spring tangs 36 of the shield 3 fail to engage with the chassis 5, the surge can also be shunted to ground via a second ground path from the terminals 24 to the printed circuit board 4. The second ground path is established through the plated tunnels 216, the surge suppressing circuitry, the apertures 212, the grounding clip 23, the grounding pins 37 of the shield 3, and the grounding traces (not shown) on the printed circuit board 4. It should be understood that, for a short ground path, the shield 3 even could be removed from the present invention, whereby the grounding clip 23 is modified correspondingly to directly connect with the grounding traces of the printed circuit board 4.

Since the surge suppressing device 28 is completely received in the housing 1 as an integral part, the modular jack of the present invention can be made compact. Further, little modification to the existing housing configuration is required, which only involves insignificantly increasing the length dimension of the existing housing. In addition, the assembly of the surge suppressing device 28 to the insulative housing 1 is significantly facilitated since it is configured as an integral module.

Although an electrical connector of a modular jack type is shown as a preferred embodiment of the present invention, it should be understood that the present invention is not limited to this specific embodiment. The concept of the present invention can also be applied to connectors of other types than the modular jack type. It should also be understood that other types of surge protectors, such as varistors, coils, tubes, semiconductor devices etc., could also be employed in the present invention instead of the disclosed capacitors. In addition, the shield 3 can be replaced by conductive material plated on the insulative housing to provide an outer conductive surface, and the configuration of the spring fingers 232 should be modified accordingly to contact with the conductive surface. This is well within the skill of one ordinary artisan.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector mounted on a grounded printed circuit board, comprising:

an insulative housing;

a dielectric substrate received in the insulative housing and provided with conductive signal traces and a surge suppressing circuitry on respective opposite major sides thereof, the conductive signal traces being electrically connected with the surge suppressing circuitry;

a plurality of terminals received in the insulative housing and electrically connected to the conductive signal traces; and grounding means for grounding the surge suppressing circuitry;

wherein the surge suppressing circuitry and the conductive signal traces are electrically interconnected by Plated tunnels defined through the dielectric substrate;

wherein the surge suppressing circuitry comprises first traces connected with the plated tunnels, an elongate grounding strip, surge protectors interconnecting the first traces with the grounding strip, and second traces interconnecting the grounding strip with the grounding means;

wherein the dielectric substrate defines plated apertures electrically connected with the second traces, and the grounding means comprises a grounding clip engaged with the plated apertures.

2. The electrical connector as claimed in claim 1, wherein the grounding means comprises a grounding clip electrically connected with the surge suppressing circuitry and adapted for being grounded to the printed circuit board.

3. The electrical connector as claimed in claim 1, wherein the surge protector is a capacitor.

4. The electrical connector as claimed in claim 1, wherein the dielectric substrate defines first and second arrays of through holes receiving the terminals therein and interconnected by the conductive signal traces.

5. The electrical connector as claimed in claim 4, wherein the surge suppressing circuitry is located between the first and second arrays of through holes.

6. The electrical connector as claimed in claim 1, further comprising a shield enclosing the insulative housing and adapted for being grounded to the printed circuit board, the shield being mechanically and electrically engaged with the grounding means.

7. The electrical connector as claimed in claim 6, wherein the grounding means is located between the dielectric substrate and the shield.

8. An electrical connector mounted to an electronic device chassis, comprising:

an insulative housing receiving a plurality of terminals therein; an outer conductive surface provided on the insulative housing and adapted for contacting with the electronic device chassis;

a dielectric substrate received in the insulative housing and providing a surge suppressing circuitry electrically connected with the terminals; and grounding means located between the dielectric substrate and the outer conductive surface, and establishing a ground path between the surge suppressing circuitry and the outer conductive surfaces;

wherein the dielectric substrate comprises conductive signal traces interconnecting the terminals with the surge suppressing circuitry;

wherein the conductive signal traces and the surge suppressing circuitry are respectively provided on opposite major sides of the dielectric substrate and are electrically connected with each other via Plated tunnels defined through the dielectric substrate;

wherein the outer conductive surface is configured by a shield enclosing the insulative housing;

wherein the dielectric substrate is vertically assembled to the electrical connector, and the grounding means comprises a grounding clip mounted on the dielectric substrate and engaged with an inner surface of the shield.

* * * * *